United States Patent
Gilliland et al.

(10) Patent No.: US 7,135,644 B1
(45) Date of Patent: Nov. 14, 2006

(54) PERMEABLE CONDUCTIVE SHIELD HAVING A LAMINATED STRUCTURE

(75) Inventors: Don Alan Gilliland, Rochester, MN (US); Ross T. Fredericksen, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/344,929

(22) Filed: Feb. 1, 2006

(51) Int. Cl.
*H05K 9/00* (2006.01)

(52) U.S. Cl. .................. 174/383; 174/252; 174/259; 174/350; 174/386; 257/717; 361/804; 361/818; 454/184

(58) Field of Classification Search .......... 174/252, 174/256, 259, 262–266, 350, 356, 358, 378, 174/382, 383, 386; 257/659, 717; 361/688, 361/690, 692, 719, 720, 721, 750, 751, 800, 361/804, 816, 818; 454/184
See application file for complete search history.

(56) References Cited

U.S. PATENT DOCUMENTS

| | | | |
|---|---|---|---|
| 5,928,076 A * | 7/1999 | Clements et al. ........... 454/184 |
| 6,297,446 B1 * | 10/2001 | Cherniski et al. ........... 174/383 |
| 6,351,394 B1 * | 2/2002 | Cunningham ............... 361/818 |
| 6,426,459 B1 * | 7/2002 | Mitchell .................... 174/382 |
| 6,483,719 B1 | 11/2002 | Bachman | |
| 6,496,386 B1 * | 12/2002 | Warzecha et al. ........... 174/383 |
| 6,563,198 B1 | 5/2003 | Caldwell | |
| 6,763,576 B1 | 7/2004 | Watchko et al. | |
| 6,768,524 B1 | 7/2004 | Ju | |
| 6,784,363 B1 | 8/2004 | Jones | |
| 6,884,937 B1 | 4/2005 | Mistry et al. | |
| 6,947,294 B1 * | 9/2005 | Lin et al. .................... 174/383 |
| 2003/0091777 A1 | 5/2003 | Jones et al. | |
| 2003/0222249 A1 | 12/2003 | Bunyan et al. | |
| 2004/0172502 A1 | 9/2004 | Lionetta et al. | |
| 2006/0113107 A1 * | 6/2006 | Williams .................... 174/256 |

* cited by examiner

*Primary Examiner*—Dean A. Reichard
*Assistant Examiner*—Adolfo Nino
(74) *Attorney, Agent, or Firm*—Rabin & Berdo, P.C.

(57) ABSTRACT

A permeable conductive shield providing protection from electromagnetic interference and electrostatic discharge has a laminated structure suitable for application to the foil side or the component side of a circuit board. The laminated structure includes an array of foam spacers arranged with spaces between them, a layer of foam attached to the top of the spacers, a first insulating sheet on the layer of foam spacers; a conductive sheet on the first insulating sheet, and a second insulating sheet on the conductive sheet. Each of the layers has a multiplicity of through holes aligned with corresponding through holes in the other layers and with the spaces between the foam spacers so as to allow airflow through the structure. The layers are bonded together with intervening adhesive layers. A pressure-sensitive adhesive is applied to the bottom of the spacers for attaching the permeable conductive shield to the circuit board.

14 Claims, 2 Drawing Sheets

PERMEABLE CONDUCTIVE SHIELD HAVING A LAMINATED STRUCTURE

BACKGROUND OF THE INVENTION

1. Field of the Invention

The invention relates to a permeable conductive shield providing protection from electromagnetic interference and electrostatic discharge, and in particular, to such a permeable conductive shield having a simple laminated structure suitable for application to the foil side or the component side of a printed circuit board.

2. Background Information

The operation of electronic devices such as televisions, radios, computers, medical instruments, business machines, communications equipment, and the like is attended by the generation of electromagnetic radiation within the electronic circuitry of the equipment. Such radiation often develops as a field or as transients within the radiofrequency band of the electromagnetic spectrum, i.e., between about 10 kHz and 10 GHz, and is termed "electromagnetic interference" or "EMI" as it is known to interfere with the operation of other proximate electronic devices. To attenuate EMI effects, shielding having the capability of absorbing and/or reflecting EMI energy may be employed to either confine the EMI energy within a source device, or to shield an affected device from other devices that are sources, or a combination of both. Such shielding is provided as a barrier that is interposed between the source and the affected device, and typically is configured as an electrically conductive housing that encloses the device, often as a "can" that covers a discrete component or group of components of the device. The housing can be formed of a metal or alternatively of a plastic material which is filled so as to be electrically conductive, as described for example, in U.S. Patent Publication No. 2004/017502, or which may be provided with a conductive coating generally applied across the surface of the housing, as described, for example, in U.S. Pat. No. 6,483,719.

Electrostatic discharge, or "ESD," refers to the damage that can occur to electronic components when subjected to an electrical static charge, particularly when being handled during installation or test. Some types of computer circuitry, such as semiconductor memory devices, are particularly sensitive to ESD. A common procedure for avoiding ESD is to ground the individual handling the circuitry. A more foolproof method is to enclose the circuitry in a conductive shield that is electrically connected to the circuit ground, as described, for example, in U.S. Pat. No. 6,884,937. Thus, the same conductive shield can serve to protect from both EMI and ESD.

Another problem experienced with the commonly used types of EMI shields is the build up of heat in the components being shielded. One solution that has been utilized to solve this problem is to add heat-dissipating fins to the outside of the shielding enclosure, as described in U.S. Pat. No. 6,884,937. But this solution adds to the fabrication cost of the enclosure, increases its size and weight, and is certainly not an effective solution unless some sort of metallic, heat conducting, material is used.

Thus, what is needed is a simple and easily manufactured conductive shield suitable for providing EMI and ESD protection to the foil or component side of a electronic circuit board while allowing the dissipation of heat generated in the circuits to which the shielding is applied.

SUMMARY OF THE INVENTION

It is, therefore, a principle object of this invention to provide a permeable conductive shield having an easily manufactured laminated structure.

It is another object of the invention to provide a permeable conductive shield for providing protection from electromagnetic interference and electrostatic discharge that solves the above-mentioned problems.

These and other objects of the present invention are accomplished by the permeable conductive shield having a laminated structure disclosed herein.

In an exemplary aspect of the invention, a permeable conductive shield has a laminated structure including a plurality of insulating spacers arranged in a plane, with spaces between the insulating spacers, a first insulating sheet placed on the plurality of insulating spacers; a conductive sheet placed on the first insulating sheet, and a second insulating sheet placed on the conductive sheet. Each of the insulating sheets has a multiplicity of through holes that are aligned with corresponding through holes in the conductive sheet and with the spaces between the insulating spacers so as to allow airflow through the permeable conductive shield. The through holes in the conductive sheet are sized to be below cutoff for frequencies of interest. Preferably the through holes in the second insulating sheet are smaller than those in the conductive sheet in order to avoid external shorting to the conductive sheet.

The insulating spacers are composed of a resilient material, preferably polyurethane foam. The conductive sheet is preferably composed of copper. The insulating sheets are composed of a material having a high mechanical strength so as to resist punctures, preferably polyimide film.

In another aspect of the invention, the permeable conductive shield further includes an insulating layer of the same resilient material as the insulating spacers and interposed between the top of the insulating spacers and the first insulating sheet. The insulating layer has through holes that are aligned with the through holes in the insulating sheet so as not to impede airflow through the permeable conductive shield. Preferably, the insulating layer is attached to the as leading spacers in strips such that one or more of the strips may be removed. The insulating layer with the attached insulating spacers, the first insulating sheet, the conductive sheet and a second insulating sheet, are bonded together by intervening adhesive layers.

In a further aspect of the invention, a layer of pressure-sensitive adhesive is applied to the bottom ends of the insulating spacers for attaching the permeable conductive shield to electronic circuitry. In addition, a release liner is preferably provided to cover and protect the layer of pressure sensitive adhesive before the permeable conductive shield is applied.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed toward a permeable conductive shield providing protection from electromagnetic interference and electrostatic discharge, and having a simple laminated structure suitable, for example, for application to the foil side or the component side of a printed circuit board.

Figure 1:
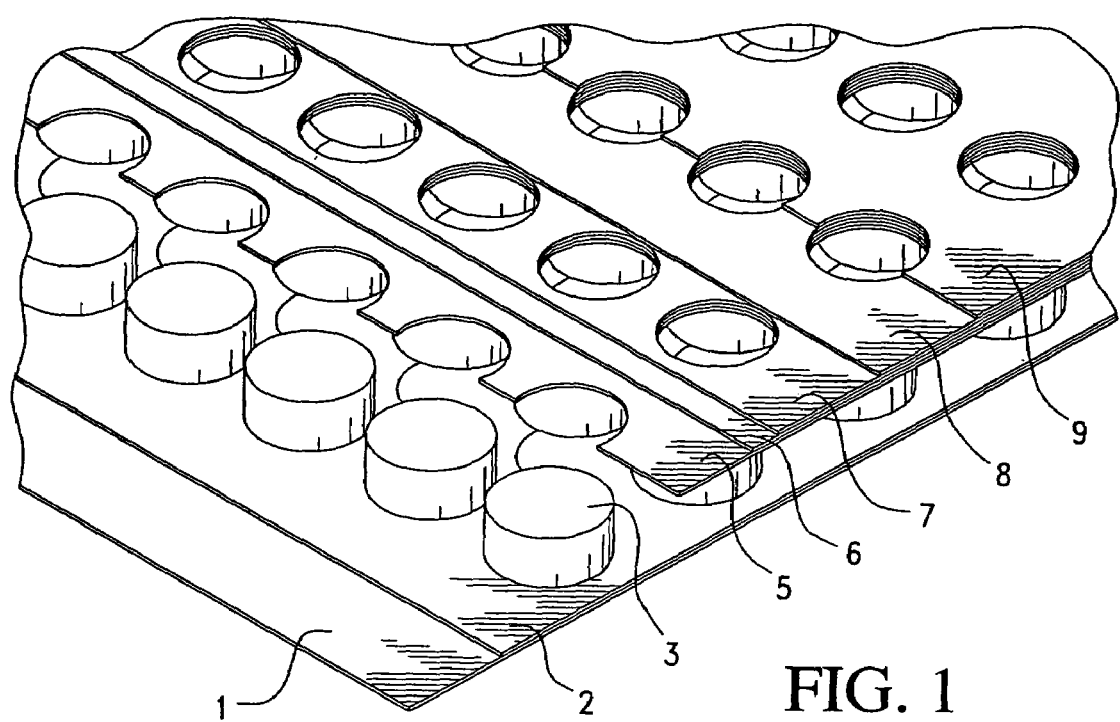
FIG. 1 shows a three-dimensional cut-away view of a permeable conductive shield according to the present invention.

FIG. 1 shows in a cut-away view a preferred embodiment of the inventive permeable conductive shield. The basic elements are a plurality of insulating foam spacers 3, an insulating sheet 5 and a conductive sheet 7. The foam spacers set the distance between the conductive sheet 7 and the surface on which the conductive shield will be mounted. When the conductive shield is mounted on a printed circuit board, for example, this distance needs to be adequate to provide clearance for components or pins protruding from the surface of the board. The foam spacers are preferably arranged in an orderly array with spaces between them that allow air to flow to the surface on which the conductive shield is mounted.

Above the foam spacers is the insulating sheet 5, which is preferably made of a strong plastic material, such as polyimide film, that gives a high dielectric strength and also prevents a pin or component lead of the circuit board below from penetrating through to the conductive layer 7. The conductive layer 7, which is on top of the insulating sheet 5 and may, for example, be a thin copper sheet or foil, provides the EMI shielding and/or ESD path for the circuit being protected.

Figure 3:
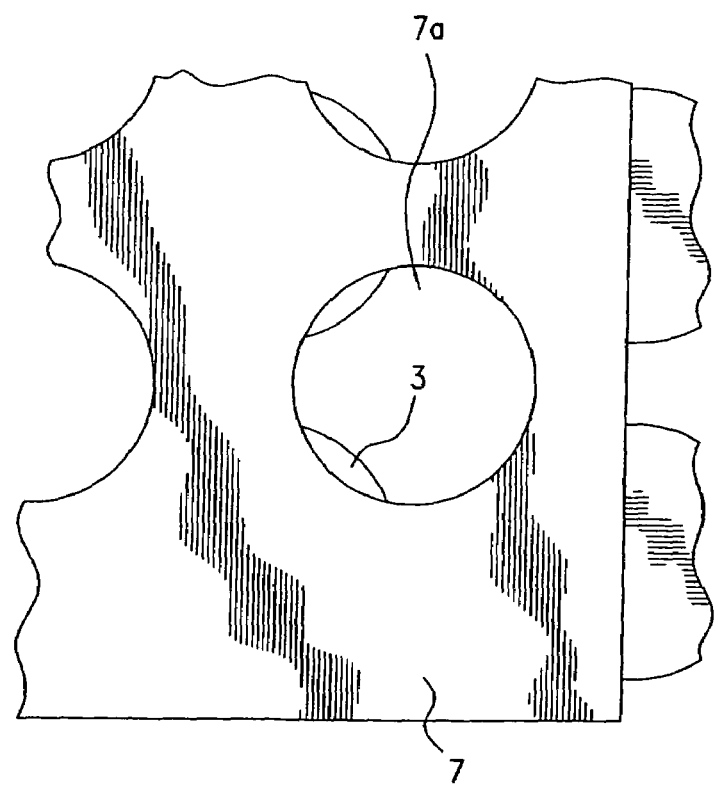
FIG. 3 shows a top view of a permeable conductive shield according to the present invention.

Both the insulating sheet 5 and the conductive sheet 7 have a plurality of through holes to allow air to pass through the permeable conductive shield. As shown in FIG. 1, the through holes in the insulating sheet 5 are aligned with the spaces between the foam spacers 3, and the through holes in the conductive sheet 7 are of about the same size and aligned with those in the insulating sheet 5. The through holes in the structure are sized small enough to be well below cutoff for the radio frequencies of interest, but large enough compared to the surrounding area to provide a reasonable amount of airflow through the permeable conductive shield. The top view of the inventive shield in FIG. 3 gives some notion of the relative sizes of the holes 7a in the conductive sheet 7, and the spaces between the foam spacers 3.

FIG. 1 also shows that the preferred embodiment of the invention includes a second insulating sheet 9 that covers the conductive sheet 7. Its purpose is to prevent accidental contact between the conductive sheet 7 and any electrical conductors within the vicinity of the permeable shield, such as a conductive or bonding layer inside an enclosure in which a circuit board with the inventive shield is installed. The second insulating sheet 9 has a plurality of through holes that match those in the first insulating sheet five and the conductive sheet 7. Preferably, the through holes in insulating sheet 9 are sized slightly smaller than those in the conductive sheet 7 to prevent possible contact with the conductive sheet 7 at the sides of the holes.

Figure 2:
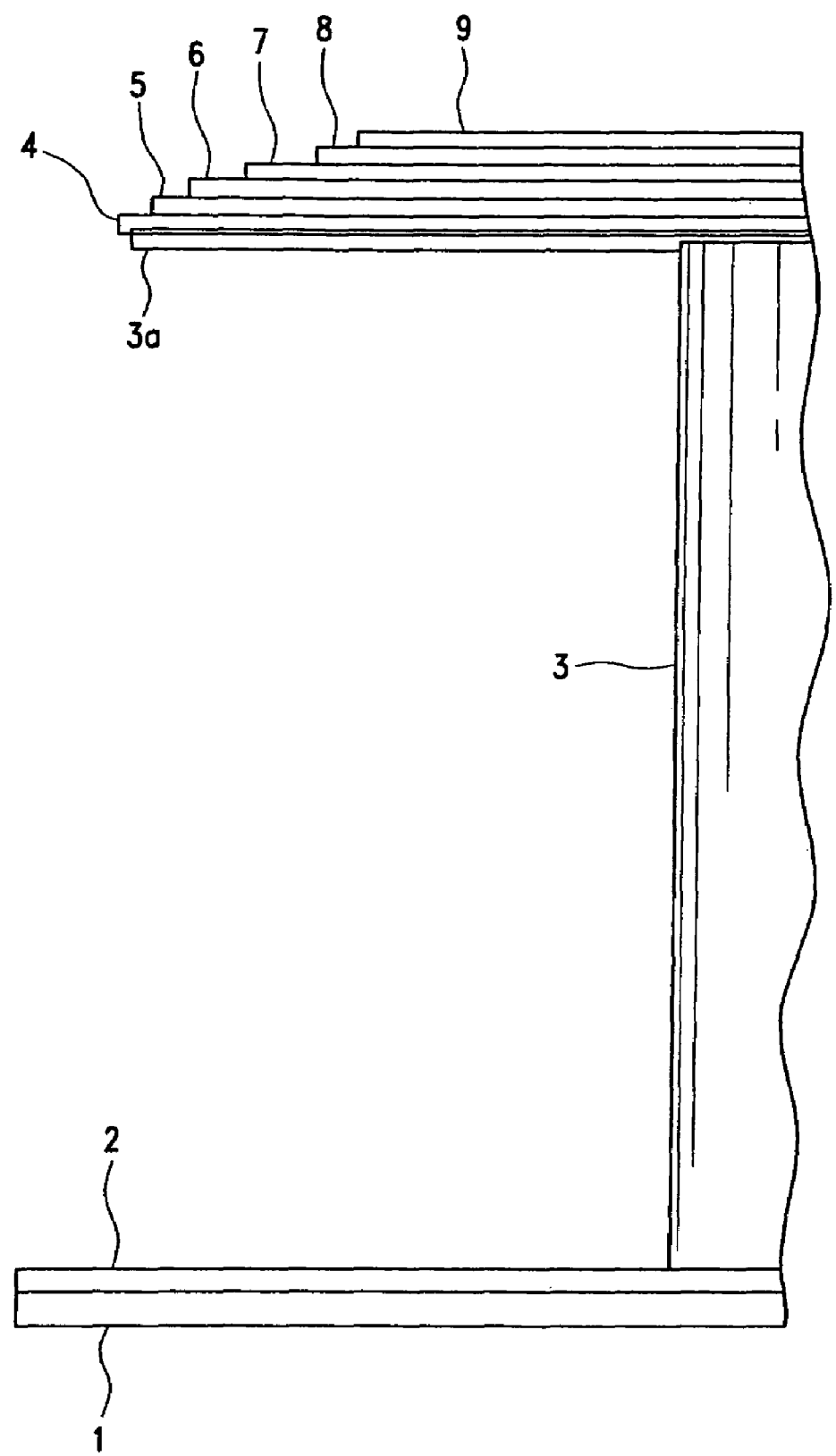
FIG. 2 shows a cross-sectional view of a permeable conductive shield according to the present invention.

FIG. 2 is a cross-sectional view that discloses more distinctly the various layers of the laminated shielding structure shown in FIG. 1. In addition to the elements of the preferred embodiment discussed above, FIG. 2 shows a relatively thin layer of foam 3a near the top of the foam spacers 3, proximate to the insulating sheet 5, that is attached to the foam spacers 3 and holds them together. Preferably, the foam layer 3a is made in strips such that one or more strips of foam spacers may be removed as necessary. The foam layer 3a also has through holes matching those in the adjacent conductive and insulating sheets in order not to obstruct the passage of air through the permeable conductive shield.

Also shown in FIG. 2 is a layer of adhesive 2, applied to the bottom ends of the foam spacers 3, to contact and hold the permeable conductive shield to the surface to which it applied. The use of a suitable pressure-sensitive adhesive allows the permeable conductive shield to be used in applications where either temporary or permanent shielding is required. A release liner 1 is used to protect the pressure-sensitive adhesive on the bottom ends of the foam spacers 3 before use, and is removed when the permeable conductive shield is to be applied to a surface.

Adhesive layers 4, 6 and 8 serve to bond together the foam layer 3a, the first and second insulating sheets 5, 9 and the conductive sheet 7, so as to form an laminated shielding structure that can be readily applied as an integrated unit to a electronic circuit board or other flat surface requiring EMI and/or ESD shielding.

In use, the permeable conductive shield may be applied to either the component side or the foil side of an electronic circuit board to form an image plane or shielding surface. In the preferred embodiment the foam pads are made of a resilient material so as to be able to accommodate irregularities in the surface of the electronic circuit. As noted earlier the foam layer 3a is preferably made in strips, so that sections of the foam layer and the attached foam spacers can be readily peeled away to make space for integrated circuits and other large devices when the inventive shield is applied to the component side of a circuit board. The laminated structure of the permeable shield can be made in a variety of thicknesses, as required. For circuit board applications, the combined thickness of the foam spacers and foam layer would typically be about 2 mm.

In applications that require the conductive sheet 7 to be electrically connected to the circuit ground, one simple grounding technique is to remove the second insulating layer around one or more of the through holes in the insulating sheet 9, and connect by soldering, for example, the conductive sheet 7 to a grounding post or posts, protruding from the circuit board. Other alternate grounding schemes will be apparent to those skilled in the art.

It should be understood that the invention is not necessarily limited to the specific process, arrangement, materials and components shown and described above, but may be susceptible to numerous variations within the scope of the invention. For example, a variety of plastic materials have similar mechanical and electrical properties may be used in the foam spacers 3 and insulating sheets 5 and 9. The conductive sheet 7 may be any suitable metal, or even a conductive coating, such as vapor-deposited aluminum, on the surface of one of the insulating sheets. Further, although the above item described exemplary aspects of the invention are believed to be particular the well-suited to a shield for electronic circuit boards that require a modicum of convective cooling, it is contemplated that the concepts of the present invention have a broader range of potential applications.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A permeable conductive shield, comprising:
    a plurality of insulating spacers disposed in a plane with spaces between the insulating spacers;
    an insulating sheet having a plurality of through holes, disposed on the plurality of insulating spacers; and
    a conductive sheet having a plurality of through holes, disposed on the insulating sheet,
    wherein the through holes in the insulating sheet are aligned with the through holes in the conductive sheet and the spaces between the insulating spacers so as to allow airflow through the permeable conductive shield.

2. The permeable conductive shield according to claim 1, wherein the plurality of insulating spacers are composed of a resilient material.

3. The permeable conductive shield according to claim 2, wherein the resilient material is a polyurethane foam.

4. The permeable conductive shield according to claim 2, further comprising:
    an insulating layer of the same resilient material as the plurality of insulating spacers, the insulating layer being attached to the insulating spacers and disposed between the insulating spacers and the insulating sheet, and having a plurality of through holes aligned with the through holes in the insulating sheet.

5. The permeable conductive shield according to claim 4, wherein the insulating layer is attached to the insulating spacers in strips such that one or more of the strips may be removed.

6. The permeable conductive shield according to claim 4, wherein the insulating sheet is a first insulating sheet, and further comprising:
    a second insulating sheet disposed on the conductive sheet, and having a plurality of through holes aligned with the through holes in the first insulating sheet.

7. The permeable conductive shield according to claim 6, wherein the first and second insulating sheets are composed of a material having a high mechanical strength so as to resist punctures.

8. The permeable conductive shield according to claim 7, wherein the first and second insulating sheets are polyimide films.

9. The permeable conductive shield according to claim 4, wherein the insulating layer with the attached plurality of insulating spacers, the first insulating sheet, the conductive sheet and the second insulating sheet, are bonded together by adhesive layers.

10. The permeable conductive shield according to claim 9, wherein each of the insulating spacers has a top end proximate to the first insulating sheet and a bottom end opposite the top end, the permeable conductive shield further comprising:
    a layer of pressure-sensitive adhesive on the bottom ends of the insulating spacers for attaching the permeable conductive shield to an electronic circuit to be shielded.

11. The permeable conductive shield according to claim 10, further comprising:
    a release liner covering and protecting the layer of pressure-sensitive adhesive on the bottom ends of the insulating spacers.

12. The permeable conductive shield according to claim 6, wherein the through holes in the second insulating sheet are slightly smaller than the through holes in the conductive sheet.

13. The permeable conductive shield according to claim 1, wherein the through holes in the conductive sheet are below cutoff for frequencies at which the permeable conductive shield provides shielding.

14. The permeable conductive shield according to claim 1, wherein the conductive sheet is composed of copper.

* * * * *